(12) United States Patent
Ishikawa et al.

(10) Patent No.: US 7,541,257 B2
(45) Date of Patent: Jun. 2, 2009

(54) SEMICONDUCTOR DEVICE HAVING THREE-DIMENSIONAL CONSTRUCTION AND METHOD FOR MANUFACTURING THE SAME

(75) Inventors: Eiji Ishikawa, Okazaki (JP); Takaaki Aoki, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/519,064

(22) Filed: Sep. 12, 2006

(65) Prior Publication Data
US 2007/0066052 A1 Mar. 22, 2007

(30) Foreign Application Priority Data
Sep. 16, 2005 (JP) .............................. 2005-270844

(51) Int. Cl.
*H01L 21/76* (2006.01)
(52) U.S. Cl. ................ 438/407; 438/458; 257/E21.568
(58) Field of Classification Search ................ 438/787, 438/626, 631; 257/623, 638, 646.629
See application file for complete search history.

(56) References Cited

U.S. PATENT DOCUMENTS

| | | | |
|---|---|---|---|
| 4,784,975 A * | 11/1988 | Hofmann et al. ............. | 438/308 |
| 4,851,370 A * | 7/1989 | Doklan et al. ................ | 438/762 |
| 6,225,190 B1 * | 5/2001 | Bruel et al. ................... | 438/458 |
| 6,429,094 B1 * | 8/2002 | Maleville et al. ............ | 438/455 |
| 6,551,946 B1 * | 4/2003 | Chen et al. ................... | 438/770 |
| 6,620,681 B1 * | 9/2003 | Kim et al. .................... | 438/257 |
| 6,689,696 B2 | 2/2004 | Lee et al. | |
| 6,723,662 B2 * | 4/2004 | Lee et al. ..................... | 438/774 |
| 2001/0008291 A1 | 7/2001 | Aoki et al. | |
| 2002/0167046 A1 | 11/2002 | Aoki et al. | |
| 2005/0090060 A1 | 4/2005 | Aoki et al. | |
| 2005/0159008 A1 * | 7/2005 | Chang et al. ................. | 438/703 |

FOREIGN PATENT DOCUMENTS

| | | |
|---|---|---|
| JP | A-07-122710 | 5/1995 |
| JP | A-2001-053250 | 2/2001 |

OTHER PUBLICATIONS

Office Action dated Aug. 31, 2007 in corresponding German Patent Application No. 10 2006 043 360.2-33 (and English translation).

* cited by examiner

*Primary Examiner*—W. David Coleman
*Assistant Examiner*—Shaka Scarlett
(74) *Attorney, Agent, or Firm*—Posz Law Group, PLC

(57) ABSTRACT

A semiconductor device includes: a silicon substrate; and a silicon oxide film disposed on the silicon substrate. The silicon oxide film includes a part, which separates from a surface of the silicon substrate, so that the silicon oxide film provides a three-dimensional construction. By using the three-dimensional construction, an additional function such as a resistor or a capacitor is easily added in the device. Further, a manufacturing method of this three-dimensional construction is simple and has a low cost.

12 Claims, 4 Drawing Sheets

SEMICONDUCTOR DEVICE HAVING THREE-DIMENSIONAL CONSTRUCTION AND METHOD FOR MANUFACTURING THE SAME

CROSS REFERENCE TO RELATED APPLICATION

This application is based on Japanese Patent Application No. 2005-270844 filed on Sep. 16, 2005, the disclosure of which is incorporated herein by reference.

FIELD OF THE INVENTION

The present invention relates to a semiconductor device having a three-dimensional construction and a method for manufacturing the same.

BACKGROUND OF THE INVENTION

When a resistor on a semiconductor substrate has a three-dimensional construction, a resistance length of the resistor becomes longer even if the resistor has a same occupation area compared with a conventional planar type resistor. Thus, the resistor having the three-dimensional construction has a large resistance compared with a conventional planar type resistor having a planar construction. For example, a poly-silicon thin film resistor can be formed easily by using a conventional silicon process, compared with a chrome-silicon alloy thin film resistor. However, the resistance of the poly-silicon thin film resistor is smaller than that of the Cr—Si alloy thin film resistor. Accordingly, when the poly-silicon thin film resistor has the three-dimensional construction, the poly-silicon thin film resistor has a small occupation area and a large resistance. Further, the poly-silicon thin film resistor can be formed with a low cost. Similarly, when a capacitor has a three-dimensional construction, an electrode area in the capacitor becomes large. Thus, the capacitance of the capacitor having the three-dimensional construction becomes large, compared with a conventional capacitor having a planar construction.

Thus, it is required for the capacitor and the resistor to have the three-dimensional construction so that the capacitor and the resistor have a large capacitance and a large resistance, and further, they have small occupation areas.

A semiconductor device having the above capacitor and/or the resistor having the three-dimensional construction is disclosed in, for example, JP-A-H07-122710, JP-A-2001-53250 and U.S. Pat. No. 6,689,696-B1.

In JP-A-H07-122710, a resistor is covered with an insulation film, and then, a groove is formed in a lateral direction by using a dry-etching method. After that, an etchant is poured into the groove, so that a cavity is formed. Further, the resistor having the three-dimensional construction is formed by using a substrate as a mold. Thus, a variation of impedance in the resistor in a micro-wave region is reduced.

In JP-A-2001-53250, a semiconductor device includes a first electrode having a three-dimensional construction, a second electrode facing the first electrode and a capacitor insulation film disposed between the first and second electrodes, which provide a capacitor for accumulating information. In this case, firstly, a poly silicon film having a rough surface is formed in a deep trench. Then, the capacitor insulation film composed of a silicon nitride film, and first and second tantalum oxide films is formed. Thus, even when the trench has high aspect ratio, the capacitor insulation film has excellent homogeneity.

U.S. Pat. No. 6,689,696-B1 discloses a method for manufacturing a semiconductor device having an insulation film and a three-dimensional conductive layer. In this case, the insulation film is deposited on a semiconductor substrate with changing deposition conditions so that an inherent etching rate of the film increases in a depth direction. Thus, the insulation film is selectively etched in order to form a through hole so that a storage electrode has a three-dimensional construction. Accordingly, the height of the storage electrode increases, and therefore, effective surface area becomes larger.

In the above devices, although the devices have the three-dimensional construction for providing a resistor or a capacitor, many complicated process for forming the three-dimensional construction in the devices are required.

SUMMARY OF THE INVENTION

In view of the above-described problem, it is an object of the present disclosure to provide a semiconductor device having a three-dimensional construction. It is another object of the present disclosure to provide a method for manufacturing a semiconductor device having a three-dimensional construction.

According to a first aspect of the present disclosure, a semiconductor device includes a silicon substrate and a silicon oxide film disposed on the silicon substrate. The silicon oxide film includes a part, which separates from a surface of the silicon substrate, so that the silicon oxide film provides a three-dimensional construction. In this case, by using the three-dimensional construction, the device can provide various functions such as a resistor, a capacitor, a sensor, a solar cell and the like. Further, these functions have high performance even though an occupation area of the device is small. Furthermore, a manufacturing method of the device is simple and has a low cost.

Alternatively, the three-dimensional construction may be a wave pattern having a peak and a bottom. The part of the silicon oxide film, which separates from the surface of the silicon substrate, provides the peak of the wave pattern, and the peak of the wave pattern lies in a linear shape.

Further, the device may further include a plurality of grooves having a stripe pattern along with an extending direction. The grooves are parallel together along with the extending direction. Each groove is disposed on the silicon substrate so that the silicon oxide film on the silicon substrate is divided into a plurality of stripes. Each stripe of the silicon oxide film is sandwiched between two neighboring grooves. Each stripe has the wave pattern, and the peak of the wave pattern in each stripe extends along with a direction perpendicular to the extending direction of the groove.

Alternatively, the silicon oxide film on the silicon substrate may include a plurality of stripes so that the silicon oxide film has a stripe pattern along with an extending direction. Each stripe of the silicon oxide film has the wave pattern, and the peak of the wave pattern in each stripe extends along with a direction perpendicular to the extending direction of the stripe pattern.

According to a second aspect of the present disclosure, a method for manufacturing a semiconductor device includes steps of: preparing a silicon substrate; forming a planar silicon oxide film on the silicon substrate; and annealing the planar silicon oxide film in hydrogen atmosphere so that a part of the planar silicon oxide film separates from a surface of the silicon substrate. The part of the planar silicon oxide film separated from the silicon substrate provides a three-dimensional construction. In this case, the three-dimensional construction is formed only by annealing the planar silicon oxide film in the hydrogen atmosphere. Accordingly, the manufacturing method of the device is simple and has a low cost. By using the three-dimensional construction, the device can provide various functions such as a resistor, a capacitor, a sensor, a solar cell and the like. Further, these functions have high performance even though an occupation area of the device is small.

Alternatively, the method may further include a step of processing the planar silicon oxide film to have a stripe pattern before the step of annealing the planar silicon oxide film. The stripe pattern of the silicon oxide film includes a plurality of stripes along with an extending direction. Each stripe of the silicon oxide film has a wave pattern as the three-dimensional construction after the step of annealing the planar silicon oxide film. The wave pattern includes a peak and a bottom. The part of the silicon oxide film, which separates from the silicon substrate, provides the peak of the wave pattern. The peak of the wave pattern lies in a linear shape, and the peak of the wave pattern in each stripe extends along with a direction perpendicular to the extending direction of the stripe pattern. Further, the step of processing the planar silicon oxide film may include a step of etching the planar silicon oxide film. Furthermore, in the step of etching the planar silicon oxide film, a groove may be formed on the silicon substrate so that the planar silicon oxide film is divided into a plurality of stripes.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1A:
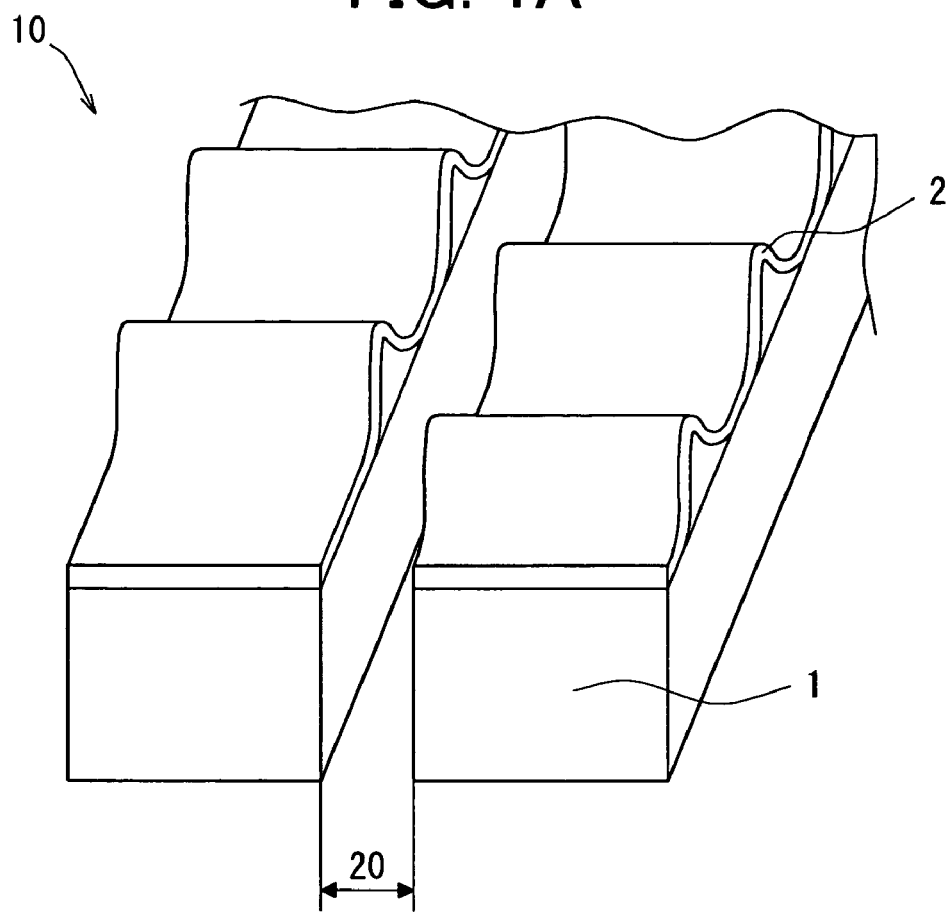
FIG. 1A is a SEM image showing a semiconductor device.
Figure 1B:
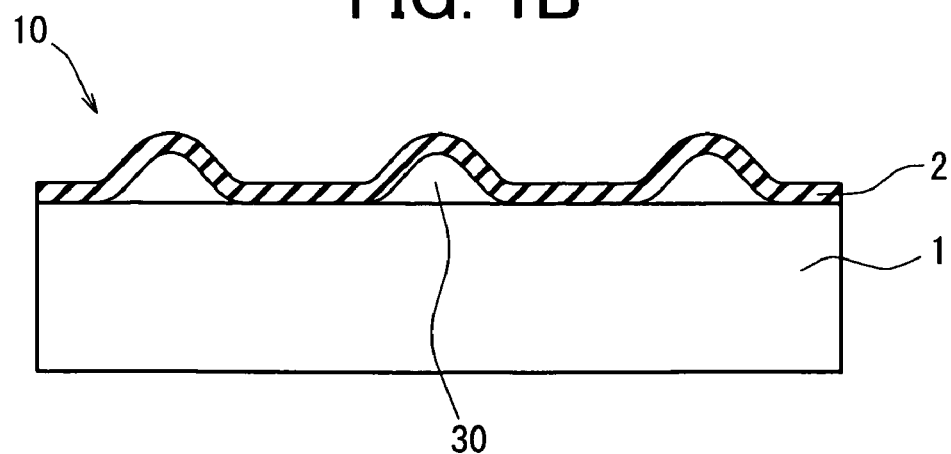
FIG. 1B is a cross sectional view showing the device as seen from a right side of FIG. 1A.

A semiconductor device 10 according to an example embodiment of the present disclosure is shown in FIGS. 1A and 1B. FIG. 1A shows a scanning electron microscope image (i.e., SEM image) of the device 10 as seen from obliquely upward. FIG. 1B is a cross section as seen from a right side of FIG. 1A, which is perpendicular to a groove.

The device 10 includes a silicon substrate 1 and a silicon oxide film 2. The silicon oxide film 2 having a three-dimensional construction is formed on the substrate 1. A part of the silicon oxide film 2 separates from the surface of the substrate 1 so that a space 30 is formed between the silicon oxide film 2 and the substrate 1.

Multiple grooves 20 having a stripe shape are formed on the surface of the substrate 1. The grooves 20 are parallel together. The silicon oxide film 2 is sandwiched between two grooves 20. The three-dimensional construction of the silicon oxide film 2 has a wave pattern including a peak and a bottom. The part of the silicon oxide film 2 separated from the surface of the substrate 1 provides the peak, which lies in a linear shape. The peak of the wave pattern is perpendicular to an extending direction (i.e., a stripe direction) of the groove 20. The grooves 20 repeatedly arranged along with the stripe direction. The other part of the silicon oxide film 2, which contacts the silicon substrate 1, provides the bottom of the wave pattern.

Thus, the silicon oxide film 2 are formed on the substrate 1 to have a stripe pattern and sandwiched between the grooves 20. The silicon oxide film 2 is deformed to be the wave pattern, and the bottom of the wave pattern of the silicon oxide film 2 contacts the substrate 1.

The three-dimensional construction, i.e., the wave pattern of the silicon oxide film 2 is formed by annealing the film 2 in hydrogen atmosphere. The groove 20 on the surface of the substrate 1 provides the wave pattern of the film 2 appropriately. Here, only the silicon oxide film 2 having the stripe pattern may be formed on the substrate 1 without forming the groove 20.

The silicon oxide film 2 is composed of two different films, which are composed of a lower layer and an upper layer. The lower layer of the silicon oxide film 2 contacts the silicon substrate 1. The lower layer is made of silicon oxide, and formed by thermally oxidizing the silicon substrate 1. The upper layer of the silicon oxide film 2 is formed of a NSG film (i.e., a non-doped silicate glass film). The total thickness of the silicon oxide film 2 is about 300 nm.

Since the lower layer is formed of a thermally-oxidized film, an interface between the substrate 1 and the lower layer is homogeneous, compared with a lower layer made of another method. Thus, the three-dimensional construction of the silicon oxide film 2 is formed reliably. Further, since the silicon oxide film 2 is formed to be a multi-layered film including the lower layer formed by thermal oxidation method and the upper layer formed by another method, a manufacturing cost of the silicon oxide film 2 is reduced even if the thickness of the silicon oxide film 2 is thick.

The three-dimensional construction of the silicon oxide film 2 provides various functions even when the device 10 has a small area, i.e., small size. For example, a resistor or a capacitor is formed on the silicon oxide film 2 so that the resistor or the capacitor has three-dimensional construction. The resistance of the resistor or the capacitance of the capacitor on the device having the three-dimensional construction is larger than that of a planar type device.

Figure 2A:
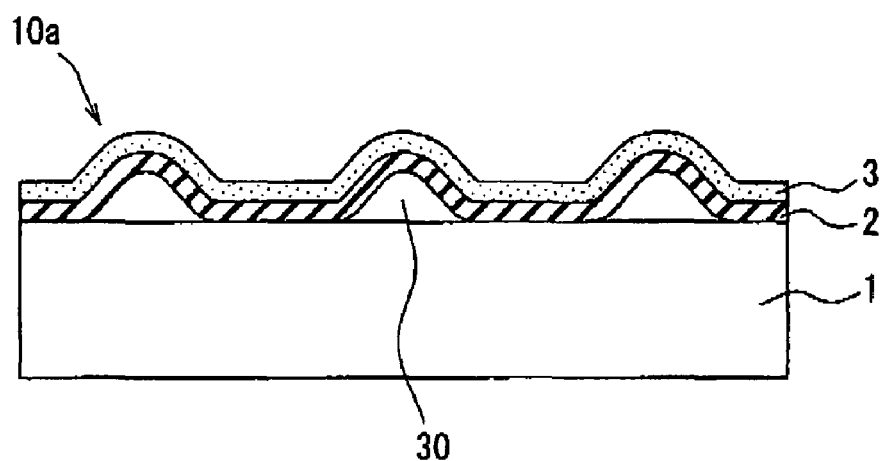
FIG. 2A is another semiconductor device having a three-dimensional construction.
Figure 2B:
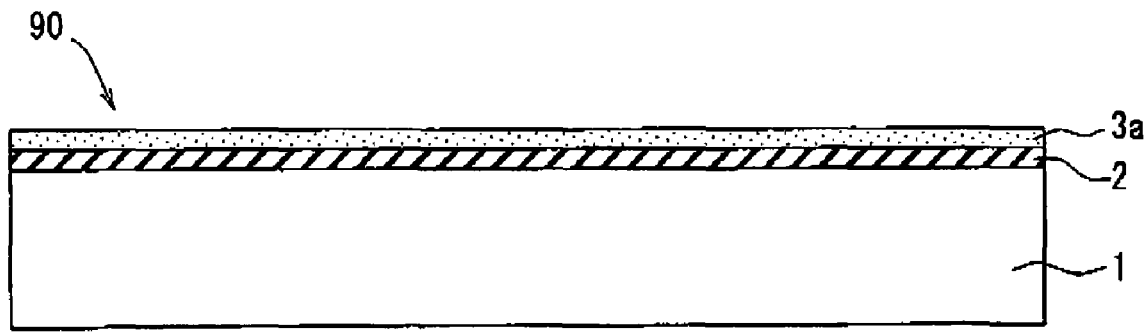
FIG. 2B is a semiconductor device having a planar construction.

Another semiconductor device 10a according to a modification of the example embodiment of the present disclosure is shown in FIG. 2A, and a planar type semiconductor device 90 as a comparison of the present disclosure is shown in FIG. 2B. The device 10a in FIG. 2A has a three-dimensional resistor, and the device 90 in FIG. 2B has a planar resistor.

In the device 10a, a poly silicon film 3 as a thin film resistor is formed on the silicon oxide film 2. Since the poly silicon film 3 is formed on the silicon oxide film 2 having the three-dimensional construction, the poly silicon film 3 also has the three-dimensional construction similar to that of the silicon oxide film 2. In the device 90, a poly silicon film 3a having a planar construction is formed on a silicon oxide film 2a having the planar construction.

The thin film resistor made of poly silicon film is easily formed by using a conventional poly silicon process, compared with a thin film resistor made of a Cr—Si alloy film. However, the resistance of the poly silicon film is small. Since the poly silicon film 3 in the device 10a has the three-dimensional construction, the resistance of the poly silicon film 3 is larger than that of the planar poly silicon film 3a in the device 90. Specifically, although the occupation area of the poly silicon film 3 is almost the same as the planar poly silicon film 3a, the resistance of the poly silicon film 3 is larger than that of the planar poly silicon film 3a. Further, the manufacturing cost of the poly silicon film 3 is small.

Further, the poly silicon film 3 in the device 10a may be used for a solar cell. In this case, the solar cell of the film 3 having the three-dimensional construction has a large surface area, i.e., a large light receiving area, compared with the solar cell of the film 3a having the planar construction. Thus, the solar cell in the device 10a has high performance compared with the device 90 even when the device 10a has the same occupation area as the device 90.

Another semiconductor device according to another modification of the example embodiment of the present disclosure may have a lower electrode film, a dielectric film and an upper electrode film, which are formed on the silicon oxide film 2 having a three-dimensional construction so that the device provides a stacking type capacitor. The capacitor formed on the silicon oxide film 2 has the same three-dimensional construction as the silicon oxide film 2. Specifically, the capacitor has a wave pattern. Accordingly, an electrode area of the capacitor having the three-dimensional construction is larger than that of a planar type capacitor, so that a capacitance of the three-dimensional type capacitor is larger than that of the planar type capacitor.

Alternatively, a sensor element may be formed on the silicon oxide film 2 having a three-dimensional construction in a device. For example, when a gas sensor is formed on the device, a surface area of the gas sensor having the three-dimensional construction is larger than that of a planar type gas sensor. Here, the surface area of the gas sensor relates to absorbance of a gas atom. Thus, a sensitivity of the three-dimensional type gas sensor is larger than that of the planar type gas sensor.

The silicon oxide film 2 having the three-dimensional construction is formed as follows.

Figure 3A:
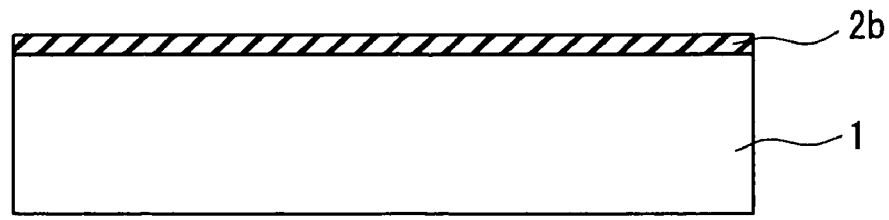
FIGS. 3A to 3C are cross sectional views showing a method for manufacturing the device shown in FIG. 1A.

Firstly, as shown in FIG. 3A, a planar silicon oxide film 2b is formed on the substrate 1 made of silicon. The planar silicon oxide film 2b may be composed of different multiple layers, each of which is formed by a different manufacturing method. Preferably, the lower layer of the planar silicon oxide film 2b may be formed by a thermal oxidation method. When the lower layer is formed by the thermal oxidation method, the interface between the lower layer and the substrate 1 becomes homogeneous, compared with the lower layer formed by another manufacturing method such as a normal pressure CVD method. Thus, the three-dimensional construction of the silicon oxide film 2 can be formed reliably and appropriately. Further, even when the thickness of the planar silicon oxide film 2b is large, the manufacturing cost of the planar silicon oxide film 2b is small since the planar silicon oxide film 2b is a multi-layer film.

Preferably, the planar silicon oxide film 2b may have a stripe pattern. In this case, the three-dimensional construction of the silicon oxide film 2 is easily and stably formed. The stripe pattern of the planar silicon oxide film 2b is formed by an etching method. Further, by etching the surface of the substrate 1, the groove 20 or a trench is formed on the substrate 1. This groove 20 stabilizes the three-dimensional construction of the silicon oxide film 2.

Figure 3B:
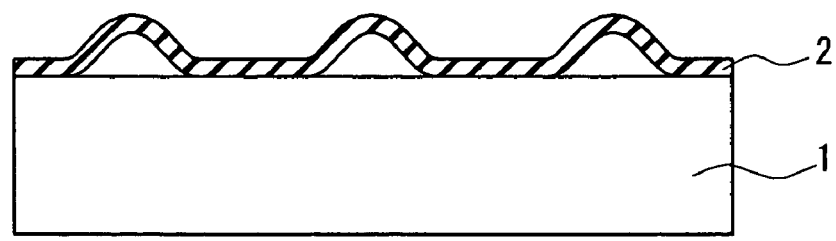

As shown in FIG. 3B, the planar silicon oxide film 2b is annealed in hydrogen atmosphere. The mechanism of forming the three-dimensional construction of the silicon oxide film 2 is supposed that:

1. the planar silicon oxide film 2b shrinks without changing the planar area of the film 2b; or 2. the connection between the planar silicon oxide film 2b and the substrate 1 is partially disconnected by compression of the planar silicon oxide film 2b, so that the disconnected part of the film 2b extends.

Here, in general, the planar silicon oxide film 2b on the substrate 1 has a compression stress therein. By annealing the planar silicon oxide film 2b in the hydrogen atmosphere under a predetermined condition, a silicon atom on the substrate 1 near the interface between the substrate 1 and the planar silicon oxide film 2b is fluidized so that an interface connection between the planar silicon oxide film 2b and the substrate 1 is partially disconnected. Thus, the planar silicon oxide film 2b, in which the compression stress is applied, shrinks. Thus, the silicon oxide film 2 having the three-dimensional construction is formed. The part of the silicon oxide film 2 separates from the surface of the substrate 1.

When the planar silicon oxide film 2b has the stripe pattern, the shrink of the planar silicon oxide film 2b is promoted. The part of the silicon oxide film 2 provides the peak of the wave pattern.

Figure 4:
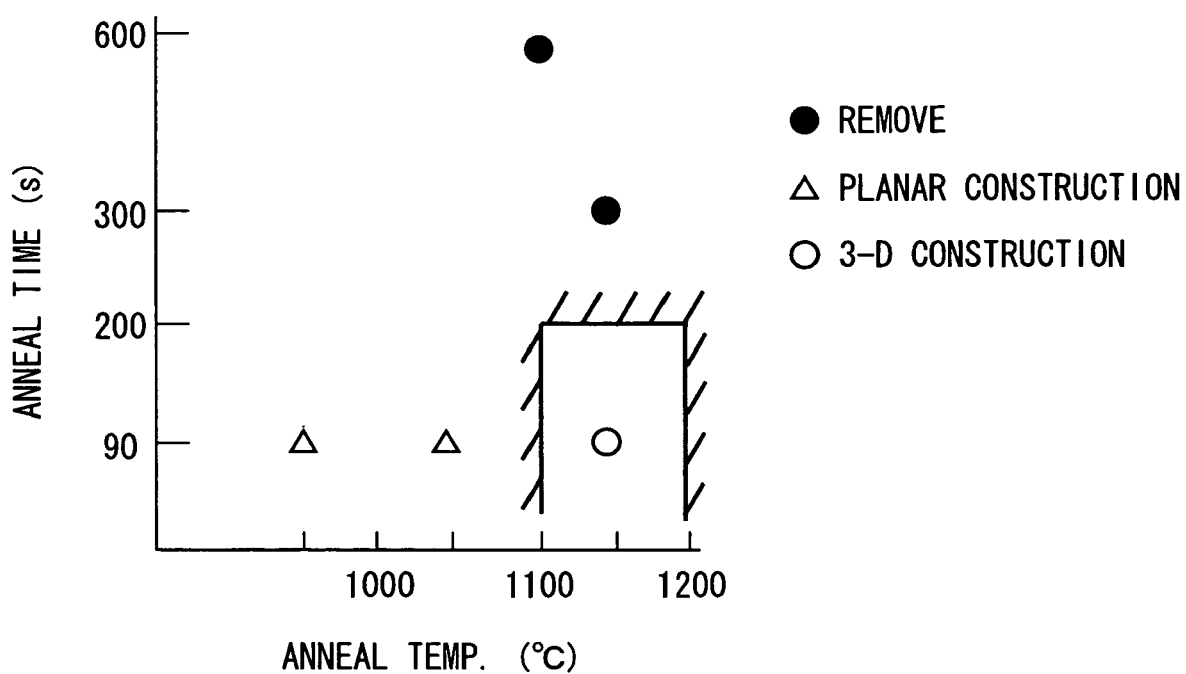
FIG. 4 is a graph showing annealing conditions of the manufacturing method of the device.

FIG. 4 is a graph explaining various anneal conditions in the hydrogen atmosphere. In FIG. 4, the planar silicon oxide film 2b includes the lower layer formed by the thermal oxidation method and the upper layer formed of the NSG film, and the total thickness of the planar silicon oxide film 2b is 300 nm. A filled circle represents that the planar silicon oxide film 2b is removed from the substrate 1. An open circle represents that the planar silicon oxide film 2b becomes the three-dimensional silicon oxide film 2. A triangle represents that the planar silicon oxide film 2b does not become the three-dimensional silicon oxide film 2.

As shown in FIG. 4, the three-dimensional silicon oxide film 2 is obtained under a condition, of which the anneal temperature is in a range between 1100° C. and 1200° C., and the anneal time is equal to or smaller than 200 seconds. This condition is shown as a hatching area in FIG. 4.

Figure 3C:
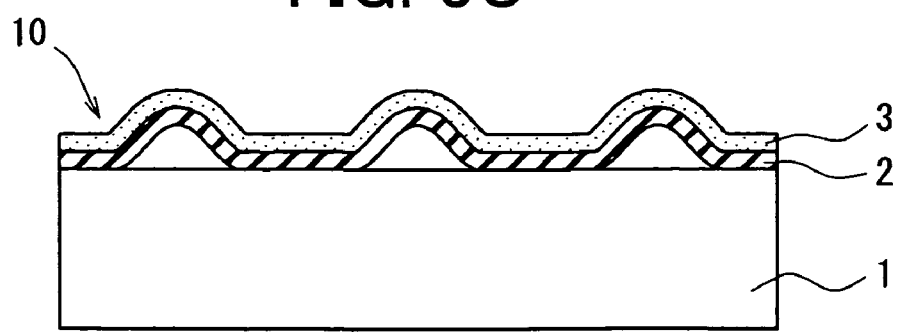

As shown in FIG. 3C, another silicon oxide film 2c is formed on the substrate 1 in order to form an electrode on the substrate easily. Specifically, the silicon oxide film 2c is formed on an area of the substrate 1, which is exposed from the planar oxide film 2b after the planar silicon oxide film 2b shrinks.

Finally, the poly silicon film 3 as the thin film resistor is formed on the three-dimensional silicon oxide film 2. Thus, the semiconductor device 10 having the three-dimensional construction is completed.

Since the planar silicon oxide film 2b becomes the three-dimensional silicon oxide film 2 only by annealing the film 2b in the hydrogen atmosphere, the manufacturing method of the device 10 is simple and has a low cost.

Here, in the process shown in FIG. 3A, a nitrogen ion may be implanted near the interface between the film 2b and the substrate 1 partially. In this case, a part of the interface, in which the nitrogen ion is introduced, provides a silicon-nitrogen connection. Accordingly, the connection between the film 2b and the substrate 1 of the part of the interface is different from that of the other part of the interface, in which no nitrogen ion is introduced. Accordingly, in the process shown in FIG. 3B, for example, the connection between the film 2b and the substrate 1 of the part of the interface is easily disconnected, compared with the connection between the film 2b and the substrate 1 of the other part of the interface. Thus, the part of the planar silicon oxide film 2b easily separates from the surface of the substrate 1. Thus, by implanting the nitrogen ion in the part of the interface partially, the part of the planar silicon oxide film 2b is easily controlled.

In the device having the three-dimensional construction, the three-dimensional construction can be controlled with nanometer size; and therefore, by using the nanometer scale construction, a shape having a nanometer size can be measured and evaluated. For example, the above device can be suitably used for a nanometer measurement such as a molecular identification and a DNA identification.

Further, the above device may be used for a bio MEMS device. For example, a predetermined chemical liquid is poured into the three-dimensional construction so that a flowing passage of the liquid is controlled by applying an electric field.

Alternatively, the device may have a reflection film on the three-dimensional construction so that a micro polarization plate is provided.

Alternatively, the device may have a film having a high specific heat on the three-dimensional construction so that a heat radiation plate is provided when a solvent or a gas flows in the three-dimensional construction.

Alternatively, the device may have a piezo electric element on the three-dimensional construction so that a sensor for detecting a deformation is provided.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising steps of:
    preparing a silicon substrate;
    forming a planar silicon oxide film on the silicon substrate; and
    annealing the planar silicon oxide film in hydrogen atmosphere so that a part of the planar silicon oxide film separates from a surface of the silicon substrate, wherein
        the part of the planar silicon oxide film separated from the silicon substrate provides a three-dimensional construction, and
        the annealing of the planar silicon oxide film is performed at a temperature higher than 1100° C. and equal to or lower than 1200° C. during a process time equal to or shorter than 200 seconds.

2. The method according to claim 1, wherein the step of forming the planar silicon oxide film includes steps of:
    forming a lower layer on the silicon substrate by a thermal oxidation method; and
    forming an upper layer on the lower layer by a method other than the thermal oxidation method.

3. A method for manufacturing a semiconductor device comprising steps of:
    preparing a silicon substrate;
    forming a planar silicon oxide film on the silicon substrate; and
    annealing the planar silicon oxide film in hydrogen atmosphere so that a part of the planar silicon oxide film separates from a surface of the silicon substrate, wherein
        the part of the planar silicon oxide film separated from the silicon substrate provides a three-dimensional construction; and
    processing the planar silicon oxide film to have a stripe pattern before the step of annealing the planar silicon oxide film, wherein
        the stripe pattern of the planar silicon oxide film includes a plurality of stripes along with an extending direction,
        each stripe of the silicon oxide film has a wave pattern as the three-dimensional construction after the step of annealing the planar silicon oxide film,
        the wave pattern includes a peak and a bottom,
        the part of the silicon oxide film, which separates from the silicon substrate, provides the peak of the wave pattern,
        the peak of the wave pattern lies in a linear shape, and
        the peak of the wave pattern in each stripe extends along with a direction perpendicular to the extending direction of the stripe pattern.

4. The method according to claim 3, wherein
the step of processing the planar silicon oxide film includes a step of etching the planar silicon oxide film.

5. The method according to claim 4, wherein
in the step of etching the planar silicon oxide film, a groove is formed on the silicon substrate so that the planar silicon oxide film is divided into a plurality of stripes.

6. The method according to claim 1, further comprising a step of:
    partially implanting a nitrogen ion near an interface between the silicon substrate and the silicon oxide film.

7. The method according to claim 1, wherein
the annealing of the planar silicon oxide film is performed at a temperature higher than 1101° C. and equal to or lower than 1200° C.

8. The method according to claim 1, wherein
the annealing of the planar silicon oxide film is performed during a process time equal to or shorter than 30 seconds.

9. The method according to claim 1, wherein
the three-dimensional construction is a wave pattern having a peak and a bottom,
the part of the silicon oxide film, which separates from the silicon substrate, provides the peak of the wave pattern,
the peak of the wave pattern lies in a linear shape, and
the peak of the wave pattern extends along with a predetermined direction.

10. The method according to claim 9, wherein
the planar silicon oxide film is made of non-doped silicate glass.

11. The method according to claim 3, wherein
the annealing of the planar silicon oxide film is performed at a temperature higher than 1100° C. and equal to or lower than 1200° C. during a process time equal to or shorter than 200 seconds.

12. The method according to claim 11, wherein
the planar silicon oxide film is made of non-doped silicate glass.

* * * * *